United States Patent [19]
Miyazaki et al.

[11] Patent Number: 5,396,248
[45] Date of Patent: Mar. 7, 1995

[54] NOISE SHAPING CIRCUIT

[75] Inventors: Shinichirou Miyazaki; Akira Shirahama, both of Kanagawa, Japan

[73] Assignee: Sony Corporation, Tokyo, Japan

[21] Appl. No.: 20,385

[22] Filed: Feb. 22, 1993

[30] Foreign Application Priority Data

Feb. 29, 1992 [JP] Japan ................... 4-079359

[51] Int. Cl.⁶ ............................................ H03M 1/08
[52] U.S. Cl. .................................................. 341/200
[58] Field of Search ............... 341/200, 143, 144, 155, 341/158, 161, 162, 166; 375/27, 28

[56] References Cited

U.S. PATENT DOCUMENTS 5,227,795 7/1993 Yamakido et al. ................ 341/166

*Primary Examiner*—Brian K. Young
*Attorney, Agent, or Firm*—Jay H. Maioli

[57] ABSTRACT

A noise shaping circuit in which the second significant bit of quantization input data in 2's complement representation, supplied to a quantizer, is taken out after complementation by an inverter 30, while the second significant bit and following bit or bits are taken out as such without complementation, for producing a quantization is error, which is subtracted from an input signal to render it possible to abbreviate an operation of finding the quantization error. A sole inverter may be used in substitution for a circuit portion employed for finding the quantization error for significantly diminishing the circuit scale.

19 Claims, 3 Drawing Sheets

NOISE SHAPING CIRCUIT

BACKGROUND OF THE INVENTION

This invention relates to a noise shaping circuit for reducing the quantization error produced in a quantizer for audio signals.

Heretofore, when sampling input signals at a sampling frequency fs, quantizing the sampled input signals into digital signals and requantizing the digital signals for reducing the number of bits, quantization noises produced at the re-quantizer are frequently fed back via a noise filter to an input side of the quantizer to reduce the quantization noise or quantization distortion by way of performing a quantization error reducing operation by error feedback referred to hereinafter as noise shaping. It is the noise shaping circuit which carries out the noise shaping. With the noise shaping circuit, the spectrum of the quantization noise is moved to a frequency range outside the audible range, for example, to a higher frequency range outside the audible range, to improve the S/N ratio within the audible range.

In general, in a first order noise shaping circuit of a basic construction, the quantization noise is found from a difference between an input and an output of a quantization circuit. However, when carrying out this operation of finding the difference, a large number of adders and flip-flops are required in a practical system for inputting data of several bits, such that the adders and the flip-flops account for about 30% of the first order noise shaping circuit, thus enlarging the circuit scale.

SUMMARY OF THE INVENTION

In view of the above-described status of the art, it is an object of the present invention to provide a noise shaping circuit whereby the circuit scale for carrying out an operation of the quantization noise may be diminished.

For accomplishing the above object, the present invention provides a noise shaping circuit in which a quantization error component in a quantizer for quantizing input signals is fed back via a predetermined feedback circuit to inn input of said quantizer, comprising quantization error outputting means for outputting a quantization error by taking out the second bit counting from the most significant bit of quantization input data in 2's complement representation supplied to said quantizer after complementation and taking out the third and the following bits of said quantization input data as such without complementation, and subtracting means for subtracting said quantization error output by said quantization error outputting means from said input signal.

It should be noticed that the second significant bit of the quantization input data in 2's complement representation corresponds to the most significant bit of the input data supplied to the noise shaping circuit.

With the noise shaping circuit according to the present invention, a quantization error outputting means supplies the second significant bit of quantization input data in 2's complement representation to a quantizer after complementation, and outputs the second significant bit and any following bit or bits of the quantization input data without complementation, and a subtracter subtracts the quantization error from the input data supplied to the noise shaping circuit, to render it possible to abbreviate an operation of finding the quantization error. A sole inverter may be used in substitution for a circuit portion for finding the quantization error, made up of full adders and D-flipflops provided with a large number of gates to render it possible to reduce the circuit scale significantly.

DETAILED DESCRIPTION OF THE INVENTION

Figure 1:
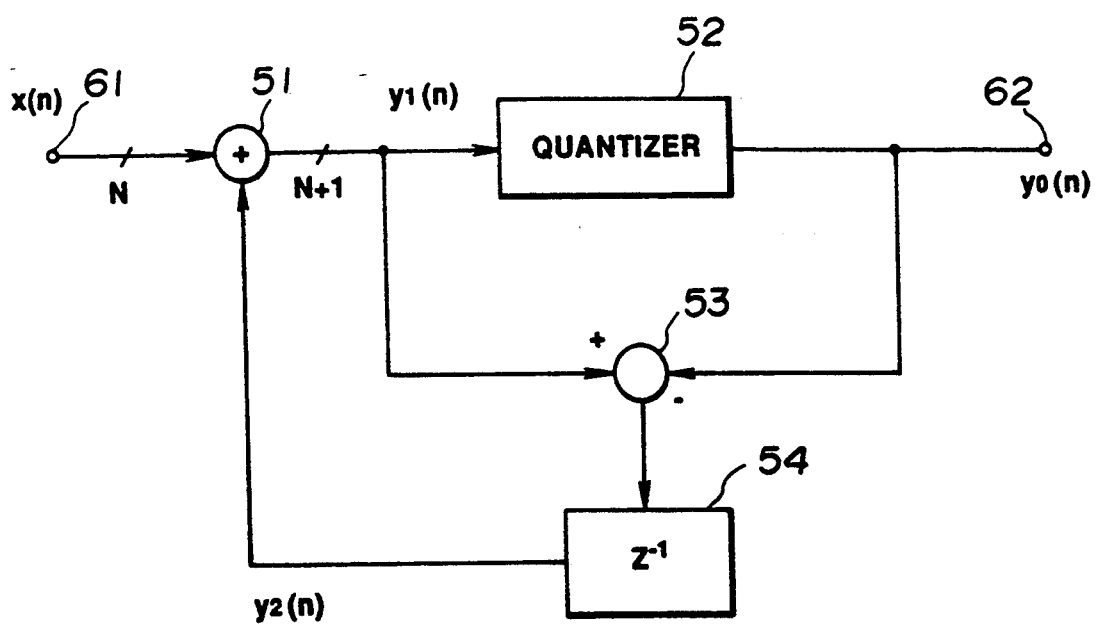
FIG. 1 is a functional block circuit diagram showing the construction of a basic first order noise shaping circuit.

Before proceeding with describing the preferred embodiment of the present invention, the construction of the basic first order noise shaping circuit is explained by referring to FIG. 1.

In the noise shaping circuit, shown in FIG. 1, audio signals supplied to an input terminal 61 are supplied via an additive node 51 to a quantization circuit 52 where they are quantized into digital audio signals of predetermined numbers of bits. The noise shaping circuit effects noise shaping of the quantization noise generated by the quantization circuit 52. That is, the signal supplied to the quantization circuit 52 is subtracted at an additive node 53 from a quantization output of the quantization circuit 52 to produce a quantization noise which is supplied to a delay circuit 54. An output of the delay circuit 54 is supplied to the additive node 51. The delay circuit 54 delays the quantization noise by a predetermined time duration corresponding to one sample $Z^{-1}$. Consequently, with the above-described noise shaping circuit, the output signal delayed by one sample is subtracted from the input of the adder 51.

Figure 2:
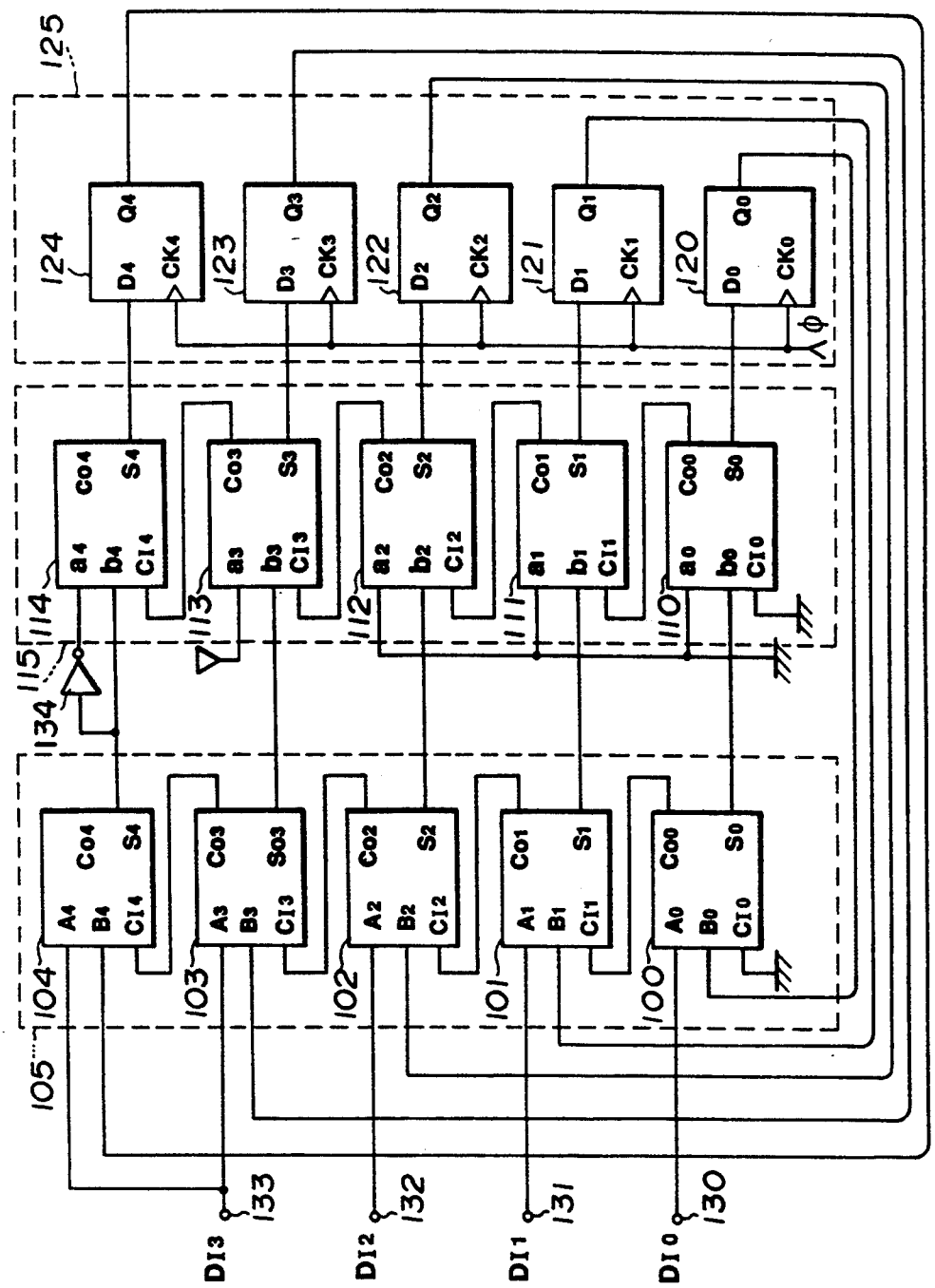
FIG. 2 is schematic view showing an arrangement of a 4 input bit first order noise shaping circuit derived from the basic first order noise shaping circuit shown in FIG. 1.

The noise shaping circuit shown in FIG. 2 is a 4 input bit first order noise shaping circuit constructed on the basis of the basic first order noise shaping circuit shown in FIG. 1.

The 4 input bit first order noise shaping circuit shown in FIG. 2 is made up of a first full adder section 105, composed of full adders 100, 101, 102, 103 and 104, a second full adder section 115 composed of full adders 110, 111, 112, 113 and 114, a latch Section 125 composed of data flipflops or D-flipflops 120, 121, 122, 123 and 124 and an inverter 134 connected across the full adder 104 of the first full adder 105 and the full adder 114 of the second full adder section 115.

Within the first full adder section 105, a carry output terminal $C_{00}$ of the full adder 100 is connected to carry input terminal $C_{I1}$ of the upper full adder 101, a carry output terminal $C_{01}$ of which is connected to a carry input terminal $C_{I2}$ of the upper full adder 102. The same state of connection as the above-described state of connection between the carry output terminal and the carry input terminal of the upper order full adder is maintained between the similar terminals of the full adders 102 and 103. However, a carry output terminal $C_{04}$ of the full adder 104 is open-circuited, whereas a carry input terminal $C_{I0}$ of the full adder 100 is grounded and is perpetually at a low (L) level.

Within the second full adder section 115, a carry output terminal $C_{00}$ of the full adder 110 is connected to a carry input terminal $C_{I1}$ of the upper order full adder 111, a carry output terminal $C_{01}$ of which is connected to a carry input terminal $C_{I2}$ of the upper order full adder 112. The same state of connection as the above-described state of connection between the carry output terminal and the carry input terminal of the upper order full adder is maintained between the similar- terminals of the full adders 112 113 and 114. However, a carry output terminal $C_{04}$ of the full adder 114 is open-circuited, whereas a carry input terminal $C_{I0}$ of the full adder 110 is grounded and is perpetually at a low (L) level. Input terminals $a_0$, $a_1$ and $a_2$ of the full adders 110, 111 and 112 are connected in common and grounded.

Within the latch section 125, clock input terminals $CK_0$, $CK_1$, $CK_2$, $CK_3$ and $CK_4$ of the D-flipflops 120, 121, 122, 123 and 124 are connected in common and fed with clocks $\phi$.

As for connection between the full adders 100, 110, D-flipflop 120 and a data input terminal 130, the data input terminal 130 is connected to input terminal $A_0$ of full adder 100, an addition output terminal $S_0$ of which is connected to an input terminal $b_0$ of the full adder 110, an addition output terminal $S_0$ of which is connected to a data input terminal $D_0$ of D-flipflop 120, an affirmation output terminal $Q_0$ of which is connected to an input terminal $B_0$ of the full adder 100.

As for connection between the full adders 101, 111, D-flipflop 121 and a data input terminal 131, data input terminal 131 is connected to input terminal $A_1$ of full adder 101, an addition output terminal $S_1$ of which is connected to an input terminal $b_1$ of the full adder 111, an addition output terminal $S_1$ of which is connected to a data input terminal $D_1$ of D-flipflop 121, an affirmation output terminal $Q_1$ of which is connected to an input terminal $B_1$ of the full adder 101.

As for connection between the full adders 102, 112, D-flipflop 122 and a data input terminal 132, data input terminal 132 is connected to an input terminal $A_2$ of the full adder 102, an addition output terminal $S_2$ of which is connected to an input terminal $b_2$ of the full adder 112, an addition output terminal $S_2$ of which is connected to a data input terminal $D_2$ of D-flipflop 122, an affirmation output terminal $Q_2$ of which is connected to an input terminal $B_2$ of the full adder 102.

As for connection between the full adders 103, 113, D-flipflop 123 and a data input terminal 133, the data input terminal 133 is connected to an input terminal $A_3$ of the full adder 103, an addition output terminal $S_3$ of which is connected to an input terminal $b_3$ of the full adder 113, an addition output terminal $S_3$ of which is connected to a data input terminal $D_3$ of D-flipflop 123, an affirmation output terminal $Q_3$ of which is connected to an input terminal $B_3$ of the full adder 103.

As for connection between the full adders 104, 114, D-flipflop 124 and a data input terminal 133, the data input terminal 133 is connected to an input terminal $A_4$ of the full adder 104, an addition output terminal $S_4$ of which is connected to an input terminal $b_4$ of the full adder 114, an addition output terminal $S_4$ of which is connected to a data input terminal $D_4$ of D-flipflop 124, an affirmation output terminal $Q_4$ of which is connected to an input terminal $B_4$ of the full adder 104.

An inverter 134 is connected between the addition output terminal $S_4$ of the full adder 104 and the input terminal $a_4$ of the full adder 114.

Input data $D_{10}$, $D_{11}$, $D_{12}$ and $D_{13}$, associated with $2^{-3}$, $2^{-2}$, $2^{-1}$ and $2^0$ digits, respectively, are fed to input terminals 130, 131, and 133, respectively.

Meanwhile, if, in the basic first order noise shaping 61 circuit shown in FIG. 1, an input supplied from input terminal is $x(n)$, an output from an output terminal 62 is $y_0(n)$, an input to quantization circuit 52 is $y_1(n)$ and an output from delay circuit 54 is $y_2(n)$, the following formulas are applicable $$y_2(n+1) = y_1(n) - y_0(n) \qquad (1)$$

$$y_1(n) = x(n) + y_2(n) \qquad (2)$$

$$\text{If } y_1(n) \geq 0, y_0(n) = 1 \qquad (3)$$

$$\text{If } y_1(n) < 0, y_0(n) = -1 \qquad (4)$$

Meanwhile, the value of "1" for $y_0(n)$ when $yl(n) \geq 0$ (formula 3) and the value of "$-1$" for $y_0(n)$ when $y_1(n) < 0$ (formula 4), in 2's complement representation in 5 bits, are as shown in Table 1:

TABLE 1

| $y_0(n)$ | sign bit | $2^0$ | $2^{-1}$ | $2^{-2}$ | $2^{-3}$ |
|---|---|---|---|---|---|
| 1 | 0 | 1 | 0 | 0 | 0 |
| $-1$ | 1 | 1 | 0 | 0 | 0 |

The most significant bits (MSBs) of the two words shown in Table 1 are sign bits, with "0" and "1" indicating positive and negative signs, respectively.

If $y_1(n) = 0$, $y_0(n)$: 1 holds from formula (3), so that the right side of the formula (1) becomes $$y_1(n) - 1 \qquad (5)$$

The operation of the formula (5), performed in the above-mentioned 2's complement representation in 5 bits, is as shown in the following formula (6):

$$\begin{array}{r} 0 \ X \ X \ X \ X \\ (+) \ 1 \ 1 \ 0 \ 0 \ 0 \\ \hline ? \ X^* \ X \ X \ X \end{array} \qquad (6)$$

In formula (6), the MSB of the 5-bit word for $y_1(n)$ and other bits are set to 0 and x, respectively, where x is equal to 0 or 1 (x=0 or 1).

Since the lower three bits "000" of the 5-bit word in 2's complement representation for "+1" as an addition input are added to the lower three bits "xxx" for yl(n) of formula (6), the lower three bits of the result of addition remain to be "xxx". Since it is the second significant bit "1" of the addition input that is added to the second significant bit of $y_1(n)$, the second significant bit of the result of addition is the complemented second significant bit "x" of $y_1(n)$, or "x*". Since the MSB of the result of addition differs depending on whether the second significant bit "x" of $y_1(n)$ is "0" or "1", it is represented as "?". However, since the result of $y_1(n) - 1$ of the formula (5) is necessarily in a range of $+1$, the result of addition is represented by four bits. If the second significant bit, of $y_1(n)$ is "0", that is the digit $2^0$ is 0, $y_1(n) - 1$ is less than 0, that is, $y_1(n) - 1 < 0$. That is "x*" of the result of addition is "1", such that the MSB or the sign bit, of the results of addition becomes "1", with the result of addition becoming negative. On the other hand, if the second significant bit of $y_1(n)$ is "1", that is the digit $2^0$ is 1, $y_1(n) \geq 1$ so that $y_1(n) - 1 \geq 0$.

Consequently, "x*" of the result of addition becomes "0" because of the carry output. Since the carry input "1" is added to the MSB which is the sign bit of the result of addition, the sign bit becomes 0". That is, the result of addition becomes positive. In other words, an operation of $y_1(n)-1$ for obtaining the result, of addition has been performed by complementing the second significant, bit of $y_1(n)$, with the lower three bits remaining unchanged.

Besides, if $y_1(n)<0$, $y_0(n)=-1$ from formula 4, so that the right side of the formula (1) becomes $$Y_1(n)+1 \qquad (7)$$

The operation of the formula 7 is performed in the form of the above-mentioned 2's complement representation. The following formula (8)

$$\begin{array}{r} 1\ X\ X\ X\ X \\ (+)\ 0\ 1\ 0\ 0\ 0 \\ \hline ?\ X^*\ X\ X\ X \end{array} \qquad (8)$$

then is obtained.

Since the lower three bits "000" of the 5-bit word "+1" as an addition input in 2's complement representation are added to the lower three bits "xxx" for $y_1(n)$ of formula (8), the lower three bits of the result of addition remain to be "xxx". Since it is the second significant bit "1" of the addition input that is added to the second significant bit of $y_1(n)$, the second significant bit of the result of addition is the complemented second significant bit "x" of $y_1(n)$, or "x*". Since the MSB of the result of addition differs depending on whether the second significant bit "x" of $y_1(n)$ is "0" or "1", it is represented as "?". Since the result of $y_1(n)-1$ of the formula (7) is necessarily in a range of +1, the result of addition is represented by four bits. If the second significant bit of $y_1(n)$ is "1", that is the digit $2^0$ is 1, $y_1(n) \geq -1$, that is, $y_1(n)+1$ of formula 7 is not less than 0 ($y_1(n)+1 \geq 0$). That is "x*" of the result of addition is "0", because of a carry input, Thus the MSB or the sign bit of the results of addition becomes "0", because of the carry input, with the result of addition becoming positive. On the other hand, if the second significant bit of $y_1(n)$ is "0", that is if the digit $2^0$ is 0, $y_1(n)<1$. Consequently, $y_1(n)+1$ of formula 7 is less than 0 $y_1(n)-+1<0$). Therefore, the "x*" of the result of addition becomes "1" and the MSB which is the sign bit of the result of addition becomes "1". That is, the result of addition becomes positive. In other words, an operation of $y_1(n)+1$ for obtaining the result of addition has been performed by complementing the second significant bit of $y_1(n)$, with the lower three bits remaining unchanged.

It will be seen from above that the operation of $y_1(n)-y_0(n)$, which is the right side of the formula (1), is within a range of ±1 and may be performed in any case by deleting the MSB of $y_1(n)$ and complementing the second significant bit of $y_1(n)$. This indicates that the 4 input bit first order noise shaping circuit may be implemented by the arrangement shown in FIG. 3.

Figure 3:
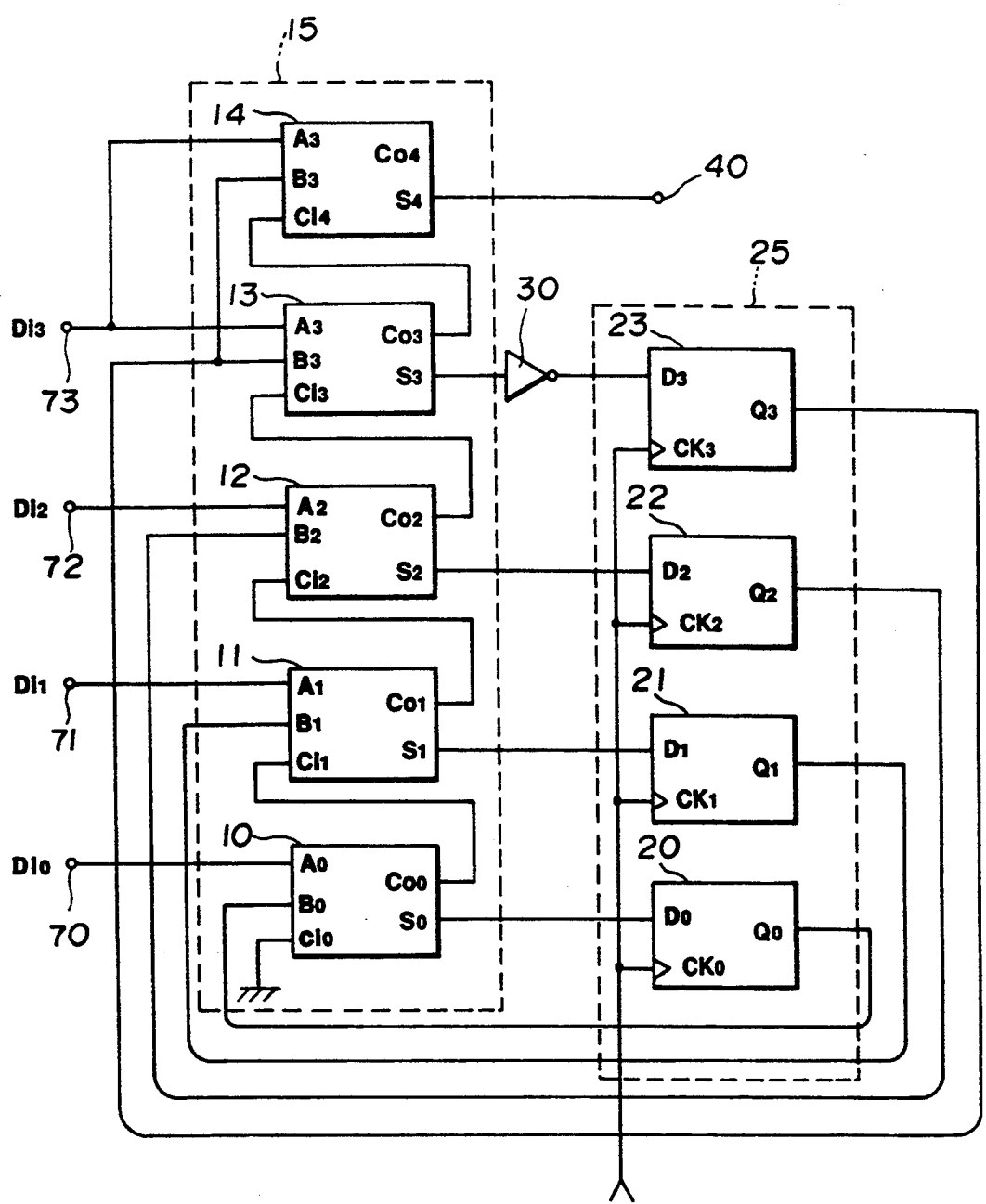
FIG. 3 is a schematic view showing an arrangement of a 4 input bit first order noise shaping circuit to which an embodiment of a noise shaping circuit according to the present invention is applied.

Referring to FIG. 3, the 4 input bit noise shaping circuit, applying the noise shaping circuit according to the present invention, is made up of a full adder section 15 composed of full adders 10, 11, 12, 13 and 14, a latch section 25 composed of D-flipflops 20, 21, 22 and 23, and an inverter 30 connected across the full adder 13 and the D-flipflop 23.

Within the second full adder section 15, a carry output terminal $C_{o0}$ of the full adder 10 is connected to a carry input terminal $C_{i1}$ of the upper full adder 11, a carry output terminal $C_{o1}$ of which as connected to a carry input terminal $C_{i2}$ of the upper full adder 12. The same state of connection as the above-described state of connection between the carry output terminal of the lower full adder and the carry input terminal of the upper full adder is maintained between the similar terminals of the full adders 12, 13 and 14. However, a carry output terminal $C_{o4}$ of the full adder 14 is open-circuited, whereas a carry input terminal $C_{i0}$ of the full adder 10 is grounded and is perpetually at a low (L) level.

Within the latch section 25, clock terminals $ck_0$, $ck_1$, $ck_2$ and $ck_3$ of the D-flipflops 20, 21, 22 and 23 are connected in common and fed with clocks $\phi$ the.

As for connection between the full adder 10, D-flipflop 20 and a data input terminal 70, the data input terminal 70 is connected to input terminal $A_0$ of full adder 10, an addition output terminal $S_0$ of which is connected to a data input terminal $D_0$ of D-flipflop 20, and an affirmation output terminal $Q_0$ of which is connected to an input terminal $B_0$ of the full adder 10.

As for connection between the full adder 11, D-flipflop 21 and a data input terminal 71, the data input terminal 71 is connected to input terminal $A_1$ of full adder 11, an addition output terminal $S_1$ of which is connected to a data input terminal $D_1$ of D-flipflop 21, and an affirmation output terminal $Q_1$ of which is connected to an input terminal $B_1$ of the full adder 11.

As for connection between the full adder 12, D-flipflop 22 and a data input terminal 72, the data input terminal 72 is connected to input terminal $A_2$ of full adder 12, an addition output terminal $S_2$ of which is connected to a data input terminal $D_2$ of D-flipflop 22, and an affirmation output terminal $Q_2$ of which is connected to an input terminal $B_2$ of the full adder 12.

As for connection between the full adder 13, D-flipflop 23 and a data input terminal 73, the data input terminal 73 is connected to input terminal $A_3$ of full adder 13, an addition output terminal $S_3$ of which is connected to a data input terminal $D_3$ of D-flipflop 23, and an affirmation output terminal $Q_3$ of which is connected to an input terminal $B_3$ of the full adder 13.

The full adder 14 has its input terminals $A_4$ and $B_4$ connected to data input terminal 73 and to affirmation output terminal $Q_3$, respectively, and its addition output terminal $S_4$ connected to output terminal 40.

Input data $D_{i0}$, $D_{i1}$, $D_{i2}$ and $D_{i3}$, associated with places $2^{-3}$, $2^{-2}$, $2^{-1}$ and $2^0$, respectively, are fed to input terminals 50, 51, 52 and 53, respectively.

As compared to the conventional 4 input bit primary noise shaping circuit shown in FIG. 2, the above-described 4 input bit primary noise shaping circuit shown in FIG. 3 is not provided with the five full adders 110, 111, 112, 113 and 114 of the full adder section 115, nor the D-flipflop 124 of the latch section 125. Also, as compared with the basic first order noise shaping circuit shown in FIG. 1, the additive node 53 for effecting subtraction is eliminated.

Consequently, with the 4 input bit first order noise shaping circuit, applying an embodiment of the noise shaping circuit according to the present invention, the operation of the portion of the circuit constituted by the full adders and the D-flipflop each having a larger number of gates may be performed by a sole inverter to decrease the circuit scale significantly.

It is to be noted that the noise shaping circuit according to the present invention is not limited to the above-described embodiments. For example, the number of inputs to the noise shaping circuit may be any arbitrary number.

What is claimed is:

1. A noise shaping circuit in which a quantization error component in a quantizer for quantizing input signals is removed from input signals, comprising:
    a feedback circuit for feeding back said quantization error component to an input of said quantizer; and
    inverter means for taking a complement of a second bit as counted from a most significant bit of input quantization data supplied to said quantizer,
    wherein said quantization error component comprises said input quantization data with said second bit as counted from the most significant bit of input quantization data supplied to said quantizer complemented by said inverter means and third and subsequent bits of said input quantization data without complementation.

2. A noise shaping circuit in which a quantization error component in a quantizer for quantizing input signals is removed from input signals, comprising:
    inverter means for taking a complement of a second bit as counted from a most significant bit of input quantization data supplied to said quantizer; and
    a feedback circuit for feeding back said quantization error component to an input of said quantizer, including
    quantization error outputting means for outputting said quantization error component which comprises said input quantization data with said second bit of said input quantization data supplied to said quantizer after complementation by said inverter means and third and subsequent bits of said input quantization data without complementation, and
    subtracting means for subtracting said quantization error component output by said quantization error outputting means from said input signals.

3. A noise shaping circuit in which a quantization error component in a quantizer for quantizing input signals is removed from input signals, comprising:
    means for taking a 2's complement of a second bit as counted from a most significant bit of input quantization data supplied to said quantizer; and
    a feedback circuit for feeding back said quantization error component to an input of said quantizer, including
    quantization error outputting means for outputting said quantization error component which comprises said input quantization data with said second bit of said input quantization data supplied to said quantizer in 2's complement representation after complementation by said complementation means and third and subsequent bits of said input quantization data without complementation, and
    subtracting means for subtracting said quantization error component output by said quantization error outputting means from said input signals.

4. A noise shaping circuit in which a quantization error component in a quantizer for quantizing input signals is removed from input signals, comprising:
    inverter means for taking a complement of a second bit as counted from a most significant bit of input quantization data supplied to said quantizer; and
    a feedback circuit for feeding back said quantization error component to an input of said quantizer, including
    quantization error outputting means for outputting said quantization error component which comprises said input quantization data with said second bit of said input quantization data supplied to said quantizer complemented by said inverter means and third and subsequent bits of said input quantization data without complementation, said input quantization data takes on a form in which said most significant bit is a sign bit, said second bit is a unit digit and following bit or bits are subdecimal digit or digits, and
    a subtracter for subtracting said quantization error component output by said quantization error outputting means from said input signals.

5. A noise shaping circuit in which a quantization error component in a quantizer for quantizing N-bit input signals is fed back via a predetermined feedback circuit to an input of said quantizer, comprising:
    a full adder section fed with said N-bit input signals;
    an inverter for complementing a second significant bit of (N+1) bit output signals of said full adder section; and
    an N-bit latch section fed with an inverted output signal from said inverter and third significant and following bit or bits of said output signals of said full adder section,
    wherein N-bit output signals from said latch section are supplied to said full adder section so as to be added to the N-bit input signals, and a most significant bit of said (N+1) bit addition output signals is supplied as an output signal.

6. A noise shaping circuit in which a quantization error component in a quantizer for quantizing input signals in a range of ±1 into a value of +1 or −1 is removed from input signals, comprising:
    means for taking a 2's complement of a second bit as counted from a most significant bit of input quantization data supplied to said quantizer; and
    a feedback circuit for feeding back said quantization error component to an input of said quantizer, including
    quantization error outputting means for outputting said quantization error component which comprises said input quantization data with said second bit of said input quantization data supplied to said quantizer in 2's complement representation after complementation by said complementation means and third and subsequent bits of said input quantization data without complementation, and
    subtracting means for subtracting said quantization error component output by said quantization error outputting means from said input signals.

7. A noise shaping circuit in which a quantization error component in a quantizer for quantizing input signals in a range of ±1 into a value of +1 or −1 is removed from input signals, comprising:
    inverter means for taking a complement of a second bit as counted from a most significant bit of input quantization data supplied to said quantizer; and
    a feedback circuit for feeding back said quantization error component to an input of said quantizer, including
    quantization error outputting means for outputting said quantization error component which comprises said input quantization data with said second bit of said input quantization data supplied to said quantizer complemented by said inverter means and third and subsequent bits of said input quantization data without complementation, said input quantization data takes on a form in which said most significant bit is a sign bit, said second bit is a unit digit and following bit or bits are subdecimal digit or digits, and a subtracter for subtracting said quantization error component output by said quantization error outputting means from said input signals.

8. A noise shaping circuit in which a quantization error component in a quantizer for quantizing N-bit input signals having a value in a range of ±1 into a value of +1 or −1 is fed back via a predetermined feedback circuit section to an input of said quantizer, comprising:

a full adder section fed with said N-bit input signals;

an inverter for complementing a second significant bit of (N+1) bit output signals of said full adder section; and an N-bit latch section fed with an inverted output signal from said inverter and third significant and following bit or bits of said output signals of said full adder section, wherein N-bit output signals from said latch section are supplied to said full adder section so as to be added to said N-bit input signals, and a most significant bit of said (N+1) bit addition output signals is supplied as an output signal.

9. A noise shaping circuit in which a quantization error component in a quantizer for quantizing N-bit input signals having a value in a range of ±1 into a value of +1 or −1 is fed back via a predetermined feedback circuit section to an input of said quantizer, comprising:

a full adder section fed with said N-bit input signals, said full adder section comprising (N+1) full adders;

an inverter for complementing a second significant bit of (N+1) bit output signals of said full adder section; and a latch section comprising N D-flipflops, said latch section being fed with an inverted output signal from said inverter and third significant and following bit or bits of said output signals of said full adder section, wherein N-bit output signals from said latch section are supplied to said full adder section so as to be added to said N-bit input signals, and a most significant bit of said (N+1) bit addition output signals is supplied as an output signal.

10. A noise shaping circuit in which a quantization error component in a quantizer for quantizing N-bit input signals having a value in a range of ±1 into a value of +1 or −1 is fed back via a predetermined feedback circuit section to an input of said quantizer, comprising:

a full adder section comprising N full adders fed with said N-bit input signals and a full adder of highest order supplied with a most significant bit of said N-bit input signals;

an inverter for complementing a second significant bit of (N+1) bit output signals of said full adder section; and a latch section comprising N flipflops, said latch section being fed with an inverted output signal from said inverter and third significant and following bit or bits of said output signals of said full adder section, wherein N-bit output signals from said latch section are supplied to said N full adders of said full adder section and a most significant bit of said N-bit output signals of said latch section is supplied also to said highest-order full adder of said full adder section for addition to said N-bit input signals, and an output signal of said highest-order full adder of said full adder section is supplied as a sign bit of quantization output.

11. A noise shaping circuit in which a quantization error component in a quantizer for quantizing N-bit input signals having a value in a range of ±1 into a value of +1 or −1 is fed back via a predetermined feedback circuit section to an input of said quantizer, comprising:

a full adder section comprising N full adders fed with said N-bit input signals and a highest order full adder supplied with a most significant bit of said N-bit input signals;

an inverter for complementing a second significant bit of (N+1) bit output signals of said full adder section; and a latch section comprising N D-flipflops, said latch section being fed with an inverted output signal from said inverter and third significant and following bit or bits of said output signals of said full adder section, wherein N-bit output signals from said latch section are supplied to said N full adders of said full adder section and a most significant bit of said N-bit output signals of said latch section is supplied also to said highest-order full adder of said full adder section for addition to said N-bit input signals, and an output signal of said highest-order full adder of said full adder section is supplied as a sign bit of quantization output.

12. A noise shaping circuit in which a quantization error component in a quantizer for quantizing 4-bit input signals having a value in a range of ±1 into a value of +1 or −1 is fed back via a predetermined feedback circuit section to an input of said quantizer, comprising:

a full adder section comprising 4 full adders fed with said 4-bit input signals and a highest order full adder supplied with a most significant bit of said 4-bit input signals;

an inverter for complementing a second significant bit of 5 bit output signals of said full adder section; and a latch section comprising 4 flipflops, said latch section being fed with an inverted output signal from said inverter and third significant and following bit or bits of said output signal of said full adder section, wherein 4-bit output signals from said latch section are supplied to said 4 full adders of said full adder section and a most significant bit of 4-bit output signals of said latch section is supplied to said highest-order full adder of said full adder section for addition to said 4-bit input signals, and an output signal for a most significant bit of said full adder section is supplied as a sign bit of quantization output.

13. A noise shaping method for feeding back a quantization error component in a quantizer for quantizing input signals to an input of said quantizer via a predetermined feedback circuit, comprising:

complementing a second bit as counted from a most significant bit of quantization input data supplied to said quantizer; and producing said quantization error component comprising said second significant bit of said quantization input data after complementation.

14. A noise shaping method for feeding back a quantization error component in a quantizer for quantizing input signals to an input of said quantizer via a predetermined feedback circuit, comprising the steps of:

complementing a second significant bit of quantization input data supplied to said quantizer; and producing said quantization error component comprising said second significant bit of said quantization input data after complementation and a third significant bit and following bit or bits of said quantization input data without complementation.

15. A noise shaping method for feeding back a quantization error component in a quantizer for quantizing input signals to an input of said quantizer via a predetermined feedback circuit, comprising the steps of:

producing said quantization error component comprising a second significant bit of quantization input data supplied to said quantizer after complementation and a third significant bit and following bit or bits of said quantization input data without complementation; and subtracting the quantization error component supplied by said producing step from said input signals.

16. A noise shaping method for feeding back a quantization error component in a quantizer for quantizing input signals to an input of said quantizer via a predetermined feedback circuit, comprising the steps of:

producing said quantization error component comprising a second significant bit of quantization input data supplied to said quantizer in a 2's complement representation after complementation and a third significant bit and following bit or bits of said quantization input data without complementation; and subtracting the quantization error component supplied by said producing step from said input signals.

17. A noise shaping method for feeding back a quantization error component in a quantizer for quantizing input signals to an input of said quantizer via a predetermined feedback circuit, comprising the steps of:

producing said quantization error component comprising a second bit as counted from a most significant bit of input quantization data supplied to said quantizer after complementation and third and subsequent bits of said input quantization data without complementation, said input quantization data takes on a form in which said most significant bit is a sign bit, said second bit is a unit digit and said third and subsequent bits are subdecimal digit or digits; and subtracting the quantization error supplied by said producing step from said input signals.

18. A noise shaping method for feeding back a quantization error component in a quantizer for quantizing input signals having a value in a range of $+1$ into a value of $+1$ or a value of $-1$ to an input of said quantizer via a predetermined feedback circuit, comprising the steps of:

producing said quantization error component comprising a second significant bit of quantization input data supplied to said quantizer in a 2's complement representation after complementation and a third significant bit and following bit or bits of said quantization input data without complementation; and subtracting the quantization error component supplied by said producing step from said input signals.

19. A noise shaping method for feeding back a quantization error component in a quantizer for quantizing input signals having a value in a range of $\pm 1$ into a value of $+1$ or a value of $-1$ to an input of said quantizer via a predetermined feedback circuit, comprising the steps of:

producing said quantization error component comprising a second bit as counted from a most significant bit of input quantization data supplied to said quantizer after complementation and third and subsequent bits of said input quantization data without complementation, said input quantization data takes on a form in which said most significant bit is a sign bit, said second bit is a unit digit and said third and subsequent bits are subdecimal digit or digits; and subtracting the quantization error component supplied by said producing step from said input signals.

* * * * *